(12) United States Patent
Finders

(10) Patent No.: US 6,795,163 B2
(45) Date of Patent: Sep. 21, 2004

(54) LITHOGRAPHIC MANUFACTURING PROCESS, LITHOGRAPHIC PROJECTION APPARATUS, AND DEVICE MANUFACTURED THEREBY

(75) Inventor: Jozef Maria Finders, Veldhoven (NL)

(73) Assignee: ASML Netherlands B.V. (NL)

( * ) Notice: Subject to any disclaimer, the term of this patent is extended or adjusted under 35 U.S.C. 154(b) by 0 days.

(21) Appl. No.: 10/114,309

(22) Filed: Apr. 3, 2002

(65) Prior Publication Data
US 2002/0154281 A1 Oct. 24, 2002

(30) Foreign Application Priority Data

Apr. 4, 2001 (EP) .............................................. 01303201
Feb. 22, 2002 (EP) .............................................. 02251207

(51) Int. Cl.[7] .......................... G03B 27/42; G03B 27/52
(52) U.S. Cl. .......................................... 355/53; 355/55
(58) Field of Search .............................. 355/52, 53, 55, 355/77; 430/5, 30, 31; 356/399–401; 250/221

(56) References Cited

U.S. PATENT DOCUMENTS

| | | | | |
|---|---|---|---|---|
| 4,734,746 A | * | 3/1988 | Ushida et al. ................. | 355/53 |
| 4,895,780 A | | 1/1990 | Nissan-Cohen et al. ........ | 430/5 |
| 5,586,059 A | | 12/1996 | Oshelski et al. ............. | 364/552 |
| 5,631,110 A | * | 5/1997 | Shioiri et al. ................. | 430/5 |
| 5,757,673 A | * | 5/1998 | Osheiski et al. ............. | 364/552 |
| 6,128,067 A | * | 10/2000 | Hashimoto ..................... | 355/52 |

OTHER PUBLICATIONS

European Search Report for Application No. 01303201.6–1240, dated Oct. 30, 2001.
XP–000986790, Chen Lee et al., "Reducing CD Variation Via Statistically Matching Steppers", SPIE vol. 1261 Integrated Circuit Metrology, Inspection and Process Control IV (1990), pp. 63–70.
XP 000332514, Andreas Grassmann et al., "Contrast Transfer Function Measurements of Deep Ultraviolet Steppers", J. Vac. Sci. Technol. vol. 10, No. 6, Nov./Dec. 1992, pp. 3008–3011.

* cited by examiner

Primary Examiner—Henry Hung Nguyen
(74) Attorney, Agent, or Firm—Pillsbury Winthrop LLP

(57) ABSTRACT

A lithographic manufacturing process is disclosed in which a first information on a first lithographic transfer function of a first lithographic projection apparatus is obtained. The information is compared with a second information on a second lithographic transfer function of a second lithographic projection apparatus, for reference. The difference between the first and second information is calculated. Then, the change of machine settings for the first lithographic projection apparatus, needed to minimize the difference, is calculated and applied to the first lithographic projection apparatus such that the match between the first and second lithographic projection apparatus of any pitch-dependency of feature errors is improved.

14 Claims, 4 Drawing Sheets

LITHOGRAPHIC MANUFACTURING PROCESS, LITHOGRAPHIC PROJECTION APPARATUS, AND DEVICE MANUFACTURED THEREBY

This application claims priority from EP 01303201.6 filed Apr. 4, 2001 and EP 02251207.3 filed Feb. 22, 2002, incorporated herein by reference.

FIELD

The invention relates generally to lithographic apparatus and more particularly to adjusting machine settings of a lithographic apparatus to reduce imaging errors.

BACKGROUND

In general, a lithographic manufacturing process according to one embodiment of the invention comprises: providing a first lithographic projection apparatus comprising a projection system for projecting a patterned beam onto a target portion of a substrate, providing a substrate that is at least partially covered by a layer of radiation-sensitive material, providing a projection beam of radiation using a radiation system, using patterning structure to endow the projection beam with a pattern in its cross-section, projecting the patterned beam of radiation onto a target portion of the layer using the projection system to obtain a projected image, and providing a second lithographic projection apparatus for reference.

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Patent Application No. WO 98/40791, incorporated herein by reference.

A circuit pattern corresponding to an individual layer of an IC generally comprises a plurality of device patterns and interconnecting lines. Device patterns may comprise structures of different spatial arrangement such as, for example, line-space patterns ("bar patterns"), capacitor and/or bit line contacts, DRAM isolation patterns, and twin-hole patterns. Any such structure (of different spatial arrangement) is referred to hereinafter as a "feature". Fabrication of a circuit pattern involves the control of space tolerances between devices and interconnecting lines, between features, and between elements of a feature. In particular the control of space tolerance of the smallest space between two lines permitted in the fabrication of the device and/or of the smallest width of a line is of importance. Said smallest space and/or smallest width is referred to as the critical dimension ("CD"). A feature may comprise elements (such as, for example, bars) arranged in a spatially periodic manner. The length of the period associated with said spatially periodic arrangement is referred to hereinafter as the "pitch". Hence, it is possible to identify a pitch or a (limited) range of pitches for such a (periodic) feature; accordingly, in this specification reference may be made to the pitch of a feature. Generally, a distinction is made between "dense" features and "isolated" features. In the context of the present invention, a dense feature is a feature where the width of a feature element is of the order of the CD, and where the pitch is of the order of two to six times the CD. Similarly, an isolated feature is a feature comprising elements of a width of the order of the CD, and where the pitch is of the order of 6 or more times the CD. Besides circuit patterns, a feature in the context of at least one embodiment of the present invention may also relate to a test pattern for controlling a lithographic process step.

In lithography, a method known as CD-proximity matching is used to address a phenomenon known as the optical proximity effect. This effect is caused by the inherent difference in diffraction pattern for isolated features as compared to dense features. Generally, the optical proximity effect leads to a difference in critical dimension (CD) when dense and more isolated features are printed at the same time. A pitch dependence of CD will be referred to hereinafter as "CD-pitch anomaly". In the presence of CD-pitch anomaly the printed CD depends on the pitch (the inverse of the spatial frequency) at which elements of the dimension of the CD are arranged in a feature.

CD-pitch anomaly also depends on the illumination setting used. An "illumination setting" or an "illumination mode" in the context of the present invention should be interpreted throughout this specification and in the claims to comprise a setting of a preselected radiation intensity distribution in a pupil plane of the radiation system. Originally, so-called conventional illumination modes have been used which have a disc-like intensity distribution of the illumination radiation at the pupil of the radiation system. With the trend to imaging smaller features, the use of illumination settings providing annular or multi-pole intensity distributions in the pupil of the radiation system have become standard in order to improve the process window, i.e. exposure and focus latitude, for small features. However, CD-pitch anomaly becomes worse for off-axis illumination modes, such as annular illumination.

One solution to alleviate the occurrence of CD-pitch anomaly has been to apply Optical Proximity Correction (referred to hereinafter as "OPC") by biasing the different features on the reticle. For example, according to one form of biasing, the features are biased by making the lines of more isolated features on the reticle somewhat thicker so that, in the image on the substrate, they are printed with the same transverse dimension as the lines of dense features. In another form of biasing, an end correction is applied so that the lines of isolated or dense features are printed with the correct length. However, at smaller pitches and with off-axis illumination, the variation of the CD as a function of pitch is more pronounced and more nonlinearly related to pitch than at larger pitches; consequently, more line biasing has to be applied at smaller pitches and the biasing becomes more complicated. OPC is discussed, for example, in SPIE Vol. 4000, pages 1015 to 1023, "Automatic parallel optical proximity correction and verification system", Watanabe et al. As will be appreciated, advanced software algorithms and very complex mask making is required for OPC. This has significantly increased costs of masks. Generally, in a high volume manufacturing site, different lithographic projection apparatus are to be used for a lithographic manufacturing process step involving OPC. In such a situation, matching of different lithographic projection apparatus such as to reduce CD variations is normally done for one selected feature type (for example, a dense or an isolated feature) by an adjustment of exposure energy at each of said different lithographic projection apparatus save the apparatus used for reference. Such a matching of lithographic apparatus is described, for example, in C. Lee et al., "Reducing CD variation via statistically matching steppers", Proceedings of the SPIE, Vol. 1261, 63–70 (1990) and in U.S. Pat. No. 5,586,059, incorporated herein by reference. Since the matching of printed CD is substantially effectuated for one selected feature type, there is the problem that the matching of CD for features with pitches other than the pitch of the feature selected for matching can be rather poor or even out of tolerance.

SUMMARY

According to at least one embodiment of the invention, a lithographic manufacturing process comprises:

providing a first lithographic projection apparatus comprising a projection system for projecting a patterned beam onto a target portion of a substrate;

providing a substrate that is at least partially covered by a layer of radiation-sensitive material;

providing a projection beam of radiation using a radiation system;

using patterning structure to endow the projection beam with a pattern in its cross-section;

projecting the patterned beam of radiation onto a target portion of the layer using the projection system to obtain a projected image;

providing a second lithographic projection apparatus for reference;

obtaining first information on spatial-frequency dependency of a first lithographic transfer function from the projected image in the radiation sensitive layer;

obtaining second information for reference on spatial-frequency dependency of a second lithographic transfer function using the second lithographic projection apparatus;

calculating the difference between said first information and said second information;

calculating a change of machine settings of the first lithographic projection apparatus to apply to at least one of said machine settings to minimize said difference; and applying the calculated change of machine settings.

According to at least one embodiment of the invention there is provided a lithographic projection apparatus comprising:

a radiation system for providing a projection beam of radiation;

a support structure for supporting patterning structure, the patterning structure serving to pattern the projection beam according to a desired pattern;

a substrate table for holding a substrate;

a projection system for projecting the patterned beam onto a target portion of the substrate;

machine settings applicable to at least one of exposure energy setting and illumination settings;

means for changing machine settings; and a processor for calculating the difference between a first information on a first lithographic transfer function and a second information on a second lithographic transfer function, and a change of machine settings to be applied to at least one of said machine settings to minimize said difference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

Embodiments of the invention will now be described, by way of example only, with reference to the accompanying schematic drawings in which corresponding reference symbols indicate corresponding parts and in which.

DETAILED DESCRIPTION

Figure 1:
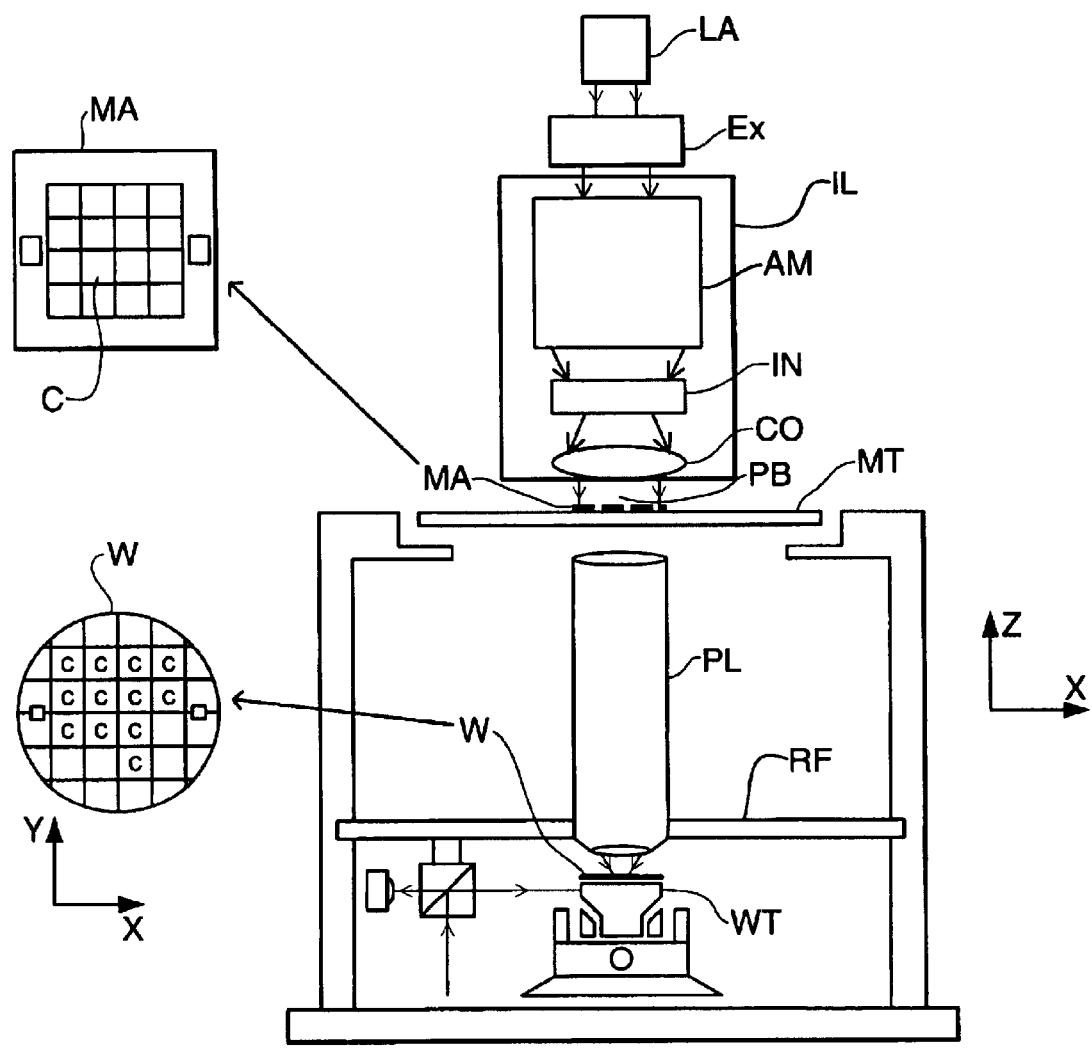
FIG. 1 depicts a lithographic projection apparatus according to an embodiment of the invention.

It is well known that the imaging properties of a projection system can in principle be characterized by an Optical Transfer Function (OTF). The physical principles related to the concept of an OTF are discussed in, for example, "Image Science", J. C. Dainty, Academic Press, 1974. This function describes the transfer of spatial frequency components by the projection system. The pattern, as provided to the projection beam by the patterning structure, features a certain spatial frequency spectrum. The product of this spectrum with the OTF yields the spatial frequency spectrum of the image of said pattern. The OTF is a function of spatial frequency, and generally the value of the OTF decreases for increasing spatial frequency. Consequently, an isolated feature is imaged differently from a dense feature (the spatial frequency spectrum of an isolated feature contains substantially lower spatial frequencies as compared to the spatial frequencies occurring in the spectrum of a dense feature). Similarly, a lithographic manufacturing process-step may be characterized by a Lithographic Transfer Function, referred to hereinafter as an "LTF". The LTF describes the transfer of spatial frequencies from the pattern, as provided to the projection beam by the patterning structure, to the pattern as printed. The term Lithographic Transfer Function in the context of at least one embodiment of the present invention should be interpreted throughout this specification and in the claims to include transfer functions which describe the transfer of spatial frequencies from a phase and/or amplitude pattern of electromagnetic radiation (as provided by the patterning structure) to the corresponding pattern as printed.

Clearly, an LTF is not unique. For example, procedures that the substrate may undergo prior and after exposure (as mentioned above), may critically affect the spatial frequency content of a printed pattern, and hence, the spatial-frequency dependency of the LTF. Also, a process run on a single lithographic projection apparatus may lead to different LTF's. This is due to the fact that, given a specific pattern to be imaged, machine settings such as, for example, exposure dose and illumination settings may critically affect the pattern as printed, and hence may critically affect the spatial frequency content of the pattern as printed, Inevitably, different lithographic projection apparatus, even of the same type, for a specific process step will have LTF's with different spatial-frequency dependencies, This may be caused, for example, by residual calibration errors of the machine settings, and residual aberration errors of lenses of the respective different lithographic projection apparatus, Also, lithographic projection apparatus of different generations or types, although operated at the same imaging specifications, may well yield different lithographic projection apparatus. Also, lithographic projection apparatus of aberration differences which are part of the nominal designs of the respective (first and second) projection systems. Since an LTF is, in the practice of projection lithography, observable through a pitch dependence of lithographic feature errors, matching LTF's can be substantially realized through matching the pitch dependency of lithographic feature errors such as, for example, CD-pitch anomaly. Once a substantial lithographic-apparatus to lithographic-apparatus matching of LTF's has been effectuated, an improved match of print CD's for a plurality of feature types characterized by a corresponding plurality of (different) pitches is obtained. For simplicity, a lithographic-apparatus to lithographic-apparatus matching as described here may be referred to hereinafter as a "machine-to-machine" matching. An additional advantage of an improved machine-to-machine matching is that the effectiveness of OPC measures provided to reticles is improved.

For application of a lithographic manufacturing process according to at least one embodiment of the present invention it is not necessary to obtain complete first and second information on the spatial-frequency dependency of the first LTF and the second LTF respectively, complete information implying information for all spatial frequencies where the LTF's are non-vanishing. For matching purposes sufficient first information on the first LTF can be the magnitude of any lithographic error as occurring in, for example, two printed features, said two features being characterized by two corresponding, different pitches. For simplicity, a lithographic error occurring in a printed feature may be referred to hereinafter as a "feature error". Generally, the magnitude of a feature error depends on the characteristic pitch for that feature. Such errors can, for example, be measured or be calculated using commercially available lithography simulation software such as Prolith™, Solid-C™ or LithoCruiser™. For example, given specific (critical) features to be imaged, given the aberration of the projection system, given the data concerning the radiation sensitive layer on the substrate, and given the radiation beam properties such as radiation energy and wavelength, predictions regarding the magnitude of feature errors can be made with these simulation programs.

Similarly, the second information (for reference) can be measured or calculated resulting in data for reference ("reference-feature errors"). The difference between the feature error and reference-feature error magnitudes can then be determined for pitches of interest.

By introducing small variations of the machine settings which are known to affect the feature error and by calculating the corresponding changes in the feature error for several pitches, coefficients quantifying the relationship between the feature error magnitude and said machine-setting changes can be established. These coefficients then also establish the relation of the machine-setting changes with the difference between the feature error and the reference-feature error for the pitches of interest.

If the number of pitches of interest equals the number of machine-setting changes available for matching, above mentioned calculations result in a set of equations where the number of equations equals the number of unknown machine-setting changes (needed for matching). Such a set of equations can be solved in principle for zero difference between the feature error and the reference feature error for any of the pitches. If the number of pitches exceeds the number of machine-setting changes to be used, one can instead minimize the feature error difference at these pitches by means of, for example, a weighted least squares minimization (a least square fit). Such a minimization will yield a set of machine-setting changes which optimizes in an objective manner the match of the pitch dependent feature error. So, by applying the set of machine-setting changes found this way, the match between pitch-dependent errors as occurring between different machines used for a specific lithographic manufacturing process can be improved.

It is an aspect of at least one embodiment of the current invention to in particular enable machine-to-machine CD-pitch anomaly-matching. It is known that for dense features (small pitches) the exposure energy can be used to change the CD as it appears in a printed feature. For isolated features both the exposure energy and, for example, the illumination settings "σ-inner" and "σ-outer", respectively defining the inner and outer radial extent (in relation to the numerical aperture of the projection system) of an annular intensity distribution in the pupil of the radiation system, can be used to affect the printed CD. Given two machine-setting changes available for use (exposure energy and, for example, σ-outer), one can in principle choose two preferred pitches and obtain substantially CD-pitch anomaly-matching for critical features occurring at these two pitches. The printed CD for isolated features is also affected, for example, by the numerical aperture setting (also referred to hereinafter as NA-setting) of the projection system, and by a displacement of the substrate in a direction substantially perpendicular to the exposed surface of the substrate. Such a displacement will be referred to hereinafter as a change of focus setting of the substrate. Another possibility to affect printed CD for isolated features is, for example, by providing to the patterned projection beam a preselected amount of even wave front aberrations. Said even wave front aberrations can, for example, comprise spherical aberration. Projection systems comprising adjustable lens elements generally enable a setting of a preselected amount of spherical wave front aberration by adjusting the axial position (along the optical axis of the projection system) of one or more projection-system lens-elements.

It is another aspect of at least one embodiment of the invention that the coefficients which quantify the relationship between the machine-setting changes and the pitch dependent error difference (which is to be compensated by matching) can also be stored in a database as sets or families of coefficients depending on the specific lithographic manufacturing process step data such as the pattern type, the illumination setting, and the NA-setting.

According to a further aspect of at least one embodiment of the invention, CD-pitch anomaly-matching is optimized exploiting the possibility of double exposure. The pattern is split up into two sub patterns, each featuring a specific range of pitches. One range of pitches contains pitches typical for dense features; the image formation of these dense features at the substrate comprises two-beam interference (i.e. the interference of, for example, a zeroth and a first order diffracted beam of radiation). For this range of pitches, the main cause for non ideal CD-pitch anomaly-matching is an exposure energy error. Matching can, for example, be achieved by an energy offset, which results in an off-set of the CD-pitch curve. The other range of pitches contains pitches typical for isolated features. Here, the image formation at the substrate comprises three-beam interference (involving, for example, a zeroth order, a plus-first and a minus-first order diffracted beam). Therefore more parameters such as, for example, focus setting, spherical wave front aberration, coherence (σ-settings), and exposure energy play a role. Matching can be achieved by creating an offset of the CD-pitch curve through an exposure dose offset, and by creating a tilt (rotation) of the CD-pitch curve by means of, for example, a σ-setting change. This method enables excellent CD-pitch anomaly-matching over a large range of pitches.

FIG. 1 schematically depicts a lithographic projection apparatus according to at least one embodiment of the present invention. The apparatus comprises:
- a radiation system Ex, IL, for supplying a projection beam PB of radiation (e.g. UV radiation). In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a quartz and/or CaF$_2$ lens system or a catadioptric system comprising lens elements made from such materials) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a UV excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention encompass at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:
1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
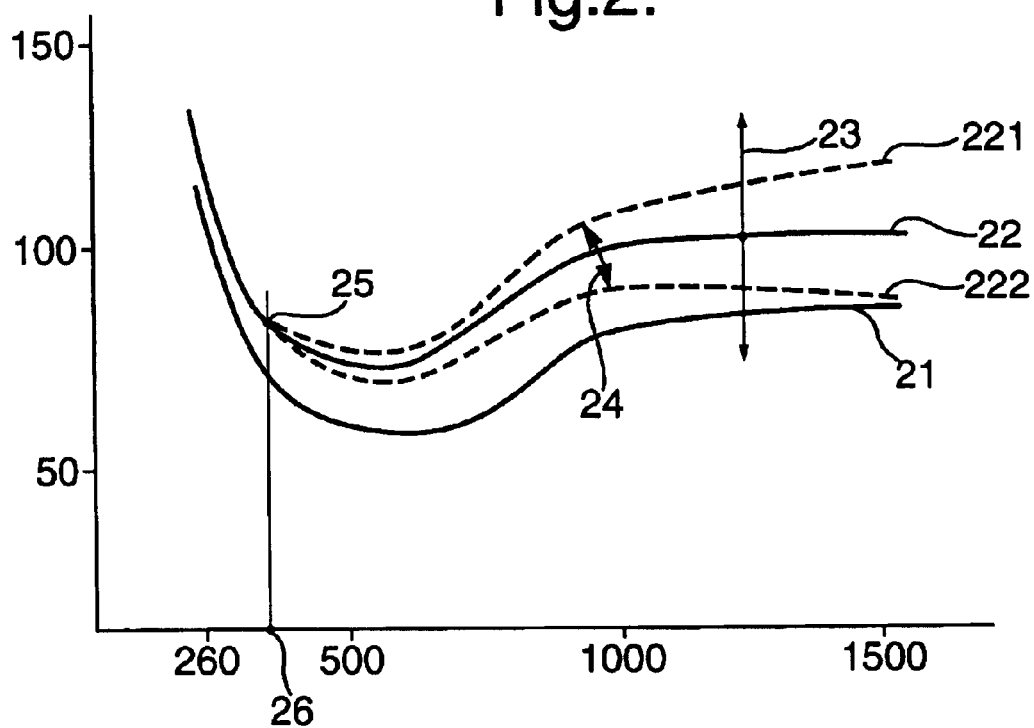
FIG. 2 shows plots of CD-pitch anomalies. Along the vertical axis the CD, as printed, is given, in nm, and along the horizontal axis the pitch is given, in nm.
Figure 3:
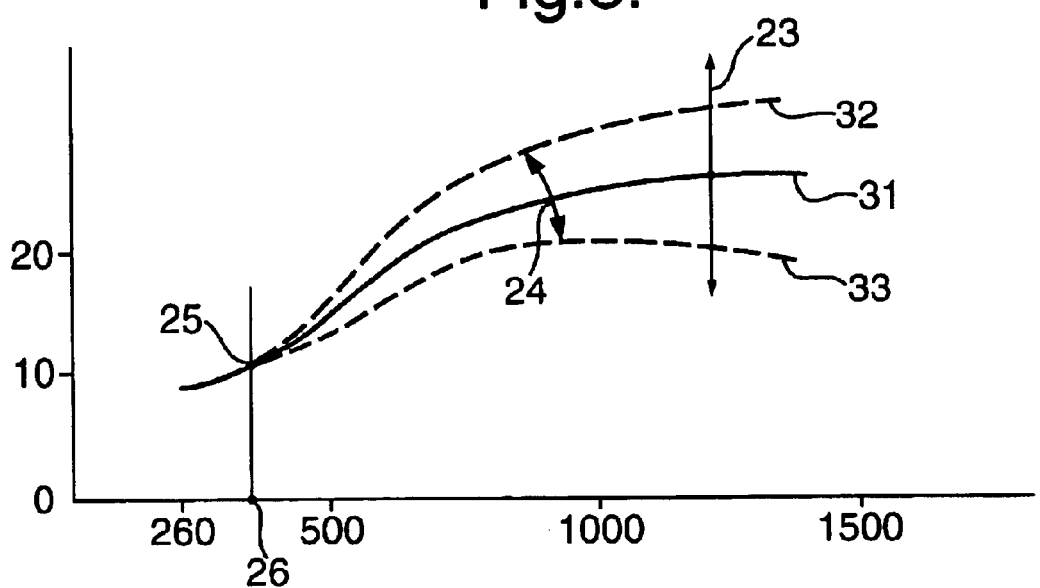
FIG. 3 shows plots of the difference between CD-pitch anomalies and a CD-pitch anomaly used for reference. Along the vertical axis the difference of CD, as printed, is given, in nm, and along the horizontal axis the pitch is given, in nm.

According to at least one embodiment of the present invention, in FIG. 2, graphs are shown which schematically indicate CD-pitch anomaly as occurring in lithographic projection apparatus. Along the vertical and horizontal axes the printed CD and the pitch are indicated, respectively. The graphs are representative for a lithographic manufacturing process characterized by the following data: the wavelength λ of the radiation beam is 248 nm, the numerical aperture is NA=0.7, the σ-outer and σ-inner settings are, respectively, 0.8 and 0.55 and the nominal CD is 130 nm. Graph 21 represents the CD-pitch anomaly characteristic for a second lithographic projection apparatus. This apparatus will for simplicity be referred to, hereinafter, as the "reference tool". Any other first lithographic projection apparatus that is to be matched will be referred to hereinafter as "tool". Graph 22 represents the CD-pitch anomaly of a tool. A small change of exposure dose applied to the tool has the effect of translating graph 22 parallel to the vertical axis, as indicated by the arrow 23. In FIG. 3, the CD-pitch anomaly-match, in nm, and defined as the difference of the CD values of the graphs 21 and 22, is plotted as a function of pitch. Said exposure dose adjustment has the same translational effect on the graph in FIG. 3 (as indicated by arrow 23) as it has on the graphs in FIG. 2. Therefore, an exposure dose adjustment can be used to shift the CD-pitch anomaly-match in FIG. 3 to the zero-nanometer level (i.e. the horizontal axis in FIG. 3). To further improve the CD-pitch anomaly-match, the effect of a change of, for example, the tool setting for σ-outer can be used. This effect is illustrated schematically in FIG. 2, and to good approximation consists of a rotation 24 about a point 25 of the part of graph 22 where the pitch is greater than a pitch Pr:

$$Pr=\lambda/NA. \quad (1)$$

The pitch Pr is indicated as pitch 26 in FIG. 2. Thus, a σ-outer adjustment results in CD-pitch anomaly graphs such as graphs 221 and 222 in FIG. 2. The corresponding effect of a σ-outer adjustment on the CD-pitch anomaly-match is indicated in FIG. 3, and involves again said rotation resulting in CD-pitch anomaly-match graphs 32 and 33, for example. Clearly a combined σ-outer change and exposure dose change resulting in a translation of graph 33 to the zero-nanometer level in FIG. 3 optimizes the CD-pitch anomaly-matching.

According to at least one embodiment of the present invention, said rotation represented by the arrow 24 in FIG. 2 and FIG. 3 is effectuated by a change of focus setting for displacing the substrate. Besides means to provide and control accurately the focus setting of the substrate, a lithographic projection apparatus may also comprise means to control and adjust spherical wave front aberration. Such means may comprise adjustable projection-system lens-elements. The effect of adjusting spherical aberration is substantially similar to the effect of a change of focus setting, and is schematically represented by arrow 24 in FIG. 2 and FIG. 3 as well. Hence, CD-pitch anomaly-matching may also comprise a projection- system lens-element adjustment. Combinations of setting changes, such as a σ-setting adjustment, a focus setting adjustment and a spherical aberration setting adjustment, can also be used for providing a rotation 24 of a CD-pitch graph, and hence, for optimizing CD-pitch anomaly-matching.

Figure 4:
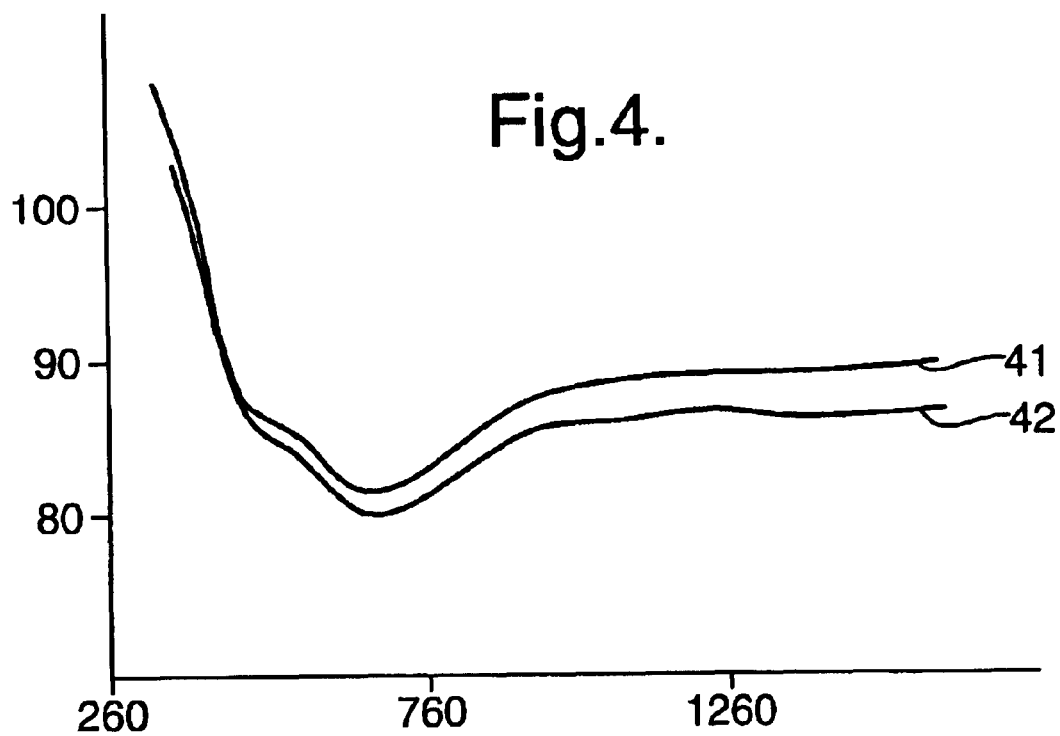
FIG. 4 shows a plot of CD-pitch anomalies illustrating the effect of a spherical aberration induced non matching. Along the vertical axis the CD, as printed, is given, in nm, and along the horizontal axis the pitch is given, in nm.
Figure 5:
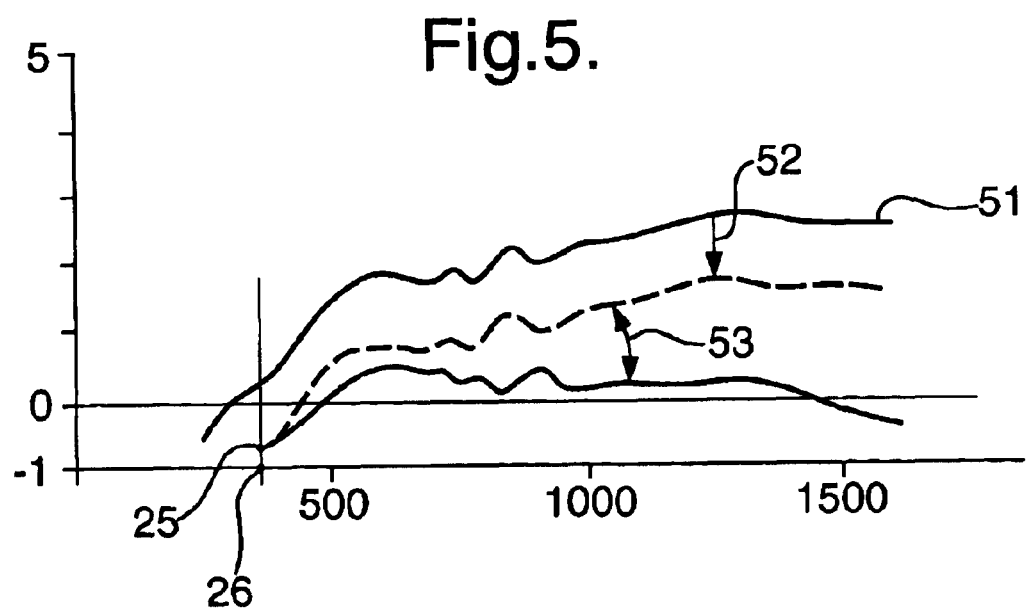
FIG. 5 shows plots of the difference between a CD-pitch anomaly and a CD-pitch anomaly used for reference, and it shows the effect of machine-setting changes. Along the vertical axis the difference of CD, as printed, is given, in nm, and along the horizontal axis the pitch is given, in nm.
Figure 6:
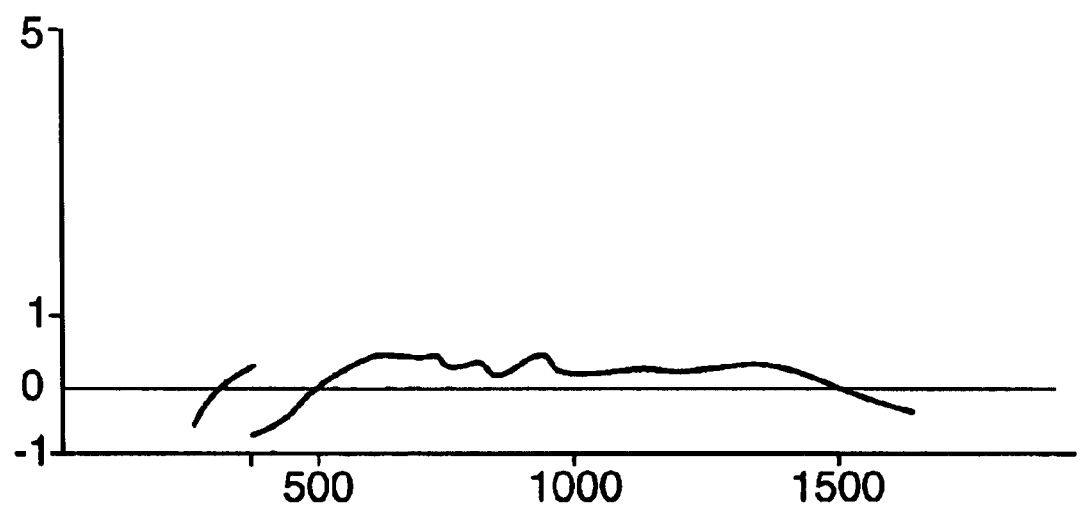
FIG. 6 shows a plot of CD-pitch anomaly illustrating the effect of using a double exposure spherical aberration induced non matching. Along the vertical axis the CD, as printed, is given, in nm, and along the horizontal axis the pitch is given, in nm.

According to at least one embodiment of the present invention, the pattern is split up into two sub patterns, one sub pattern substantially comprising features at pitches smaller than the pitch Pr, and the other sub pattern substantially comprising features at pitches greater than the pitch Pr. The advantage of said splitting up of the pattern in relation to CD-pitch anomaly-matching (and exploiting the possibility of double exposure) becomes clear when for example the effect of the presence of residual higher order spherical aberration in the projection system of the tool is considered. FIG. 4 shows CD-pitch anomaly graphs for the lithographic manufacturing process described above, where the reference tool does not exhibit spherical aberration (graph 41), and where the projection system of the tool (which is to be matched) exhibits 0.05 waves of spherical aberration characterized by the Zernike coefficient Z16 (graph 42). FIG. 5 shows a detailed plot of the calculated, resulting CD-pitch anomaly-match, see graph 51. For dense pitches (pitch<$\lambda$/NA), the match is within +1 and −1 nm, however, for isolated pitches (>$\lambda$/NA) a non matching occurs of up to +3 nm. Because of the use of double exposure, it is now possible to improve the CD-pitch anomaly-matching for pitches greater than $\lambda$/NA independent from the already obtained and sufficient CD-pitch anomaly-matching for pitches smaller than $\lambda$/NA. This is illustrated in FIG. 5, where a combined exposure dose (effect indicated by arrow 52) and σ-outer adjustment (effect indicated by arrow 53) are used to optimize the CD-pitch anomaly-matching for the sub pattern with pitches >Pr. The resulting overall CD-pitch anomaly-matching for the double exposed image is shown in FIG. 6: a match better than + and −1 nm is obtained for the complete range of pitches occurring in the pattern.

While specific embodiments of the invention have been described above, it will be appreciated that the invention may be practiced otherwise than as described. The description is not intended to limit the invention.

What is claimed is:

1. A lithographic manufacturing process comprising:
   using a first lithographic projection apparatus to project a patterned beam of radiation onto a target portion of a layer of radiation-sensitive material that at least partially covers a substrate to obtain a projected image;
   obtaining information on spatial-frequency dependency of a lithographic transfer function (LTF) of the first lithographic projection apparatus based on the projected image;
   obtaining information on spatial-frequency dependency of a LTF of a second lithographic projection apparatus;
   calculating a difference between said information of a LTF of the first lithographic projection apparatus and said information of a LTF of the second lithographic projection apparatus;
   calculating a change of at least one machine setting of the first lithographic projection apparatus to minimize said difference; and
   applying the calculated change of at least one machine setting to the first lithographic projection apparatus.

2. A lithographic manufacturing process according to claim 1, wherein said calculating a change of at least one machine setting comprises calculating a plurality of coefficients indicating quantitative relationships between said difference and at least one machine setting of the first lithographic projection apparatus.

3. A lithographic manufacturing process according to claim 2, wherein said plurality of coefficients includes a plurality of families of coefficients for at least one of different illumination settings, different settings of the projection system, and different features of then pattern to be projected.

4. A lithographic manufacturing process according to claim 1, wherein the change of at least one machine setting includes at least one of a change of exposure dose, a change of illumination setting, a change of numerical aperture of a projection system, a change of focus setting of the substrate, and a change of setting of at least one lens element of a projection system.

5. A lithographic manufacturing process according to claim 1, wherein at least one of said information of a LTF of the first lithographic projection apparatus and said information of a LTF of the second lithographic projection apparatus includes CD-pitch anomaly.

6. A lithographic manufacturing process according to claim 1, said process further comprising patterning a beam of radiation with a pattern in its cross section to obtain the patterned beam,
   wherein said pattern comprises at least two sub-patterns, each of said at least two sub-patterns comprising features having a pitch within a respective range of pitches,
   wherein said patterning a beam of radiation comprises patterning the beam according to one of the sub-patterns and then calculating and applying the change of at least one machine setting and patterning the beam according to another of the sub-patterns.

7. A lithographic manufacturing process according to claim 6 wherein the respective ranges of pitches are selected such that pitch <1.5 λ/NA and 0.7 λ/NA<pitch.

8. A device manufactured according to the process of claim 1.

9. A lithographic manufacturing process comprising:

patterning a beam of radiation with at least two sub-patterns in its cross section, each of said at least two sub-patterns comprising features having a pitch within a respective range of pitches;

using a first lithographic projection apparatus to project the patterned beam onto a target portion of a layer of radiation-sensitive material that at least partially covers a substrate to obtain a projected image;

obtaining information on spatial-frequency dependency of a lithographic transfer function (LTF) of the first lithographic projection apparatus based on the projected image;

obtaining information on spatial-frequency dependency of a LTF of a second lithographic projection apparatus;

calculating a difference between said information of a LTF of the first lithographic projection apparatus and said information of a LTF of the second lithographic projection apparatus;

calculating a change of at least one machine setting of the first lithographic projection apparatus to minimize said difference; and applying the calculated change of at least one machine setting to the first lithographic projection apparatus, wherein the respective ranges of pitches are selected such that pitch <1.5 λ/NA and 0.7 λ/NA<pitch.

10. The lithographic manufacturing process according to claim 9, wherein said using a first lithographic projection apparatus to obtain a projected image includes a double exposure.

11. The lithographic manufacturing process according to claim 10, wherein said calculating is performed with respect to each exposure of the double exposure.

12. The lithographic manufacturing process according to claim 9, wherein the change of at least one machine setting includes at least one change relating to a double exposure.

13. The lithographic manufacturing process according to claim 12, wherein the change of at least one machine setting includes a first change relating to one exposure of the double exposure and a second change relating to the other exposure of the double exposure.

14. The lithographic manufacturing process according to claim 9, wherein said patterning a beam of radiation comprises patterning the beam according to one of the sub-patterns and then calculating and applying the change of at least one machine setting and patterning the beam according to another of the sub-patterns.

* * * * *

UNITED STATES PATENT AND TRADEMARK OFFICE
CERTIFICATE OF CORRECTION

| | | |
|---|---|---|
| PATENT NO. | : 6,795,163 B2 | Page 1 of 1 |
| APPLICATION NO. | : 10/114309 | |
| DATED | : September 21, 2004 | |
| INVENTOR(S) | : Jozef Maria Finders | |

It is certified that error appears in the above-identified patent and that said Letters Patent is hereby corrected as shown below:

Col. 7, line 20 replace "," with --.--.

Col. 7, lines 23-24 replace "lithographic projection apparatus. Also, lithographic apparatus of" with --LTF's and hence, different printed patterns and/or CD's due to, for example, --.

Col. 7, line 33 replace "print" with --printed--.

Col. 12, line 43 replace "then" with --a--.

Signed and Sealed this

Fifth Day of December, 2006

JON W. DUDAS
*Director of the United States Patent and Trademark Office*